US00RE34768E

United States Patent [19]

Lee et al.

[11] E Patent Number: Re. 34,768

[45] Reissued Date of Patent: Oct. 25, 1994

[54] HYDANTOIN OR BARBITURIC ACID-EXTENDED EPOXY RESIN COMPOSITION

[75] Inventors: Tzong-Ming Lee, Tainan; Ker-Min Chen, Hsinchu, both of Taiwan

[73] Assignee: Industrial Technology Research Institute, Taiwan

[21] Appl. No.: 875,449

[22] Filed: Apr. 29, 1992

Related U.S. Patent Documents

Reissue of:

[64] Patent No.: 5,006,615
Issued: Apr. 9, 1991
Appl. No.: 538,904
Filed: Jun. 15, 1990

[51] Int. Cl.[5] ..... C08L 63/02

[52] U.S. Cl. ..... 525/526; 528/117; 528/118

[58] Field of Search ..... 525/526; 528/117, 118

[56] References Cited

U.S. PATENT DOCUMENTS

| | | | |
|---|---|---|---|
| 3,793,248 | 2/1974 | Porret et al. | 525/526 |
| 3,963,666 | 6/1976 | Schreiber et al. | 525/526 |
| 4,124,760 | 11/1978 | Green et al. | 528/117 |
| 4,672,101 | 6/1987 | Wang et al. | 528/96 |

*Primary Examiner*—Robert E. Sellers
*Attorney, Agent, or Firm*—Ladas & Parry

[57] ABSTRACT

A modified epoxy resin composition for use in making a printed circuit board comprising: (1) a modified epoxy resin obtained by reacting (a) a low molecular weight epoxy resin having at least two epoxy groups which [have] *has* the following formula,

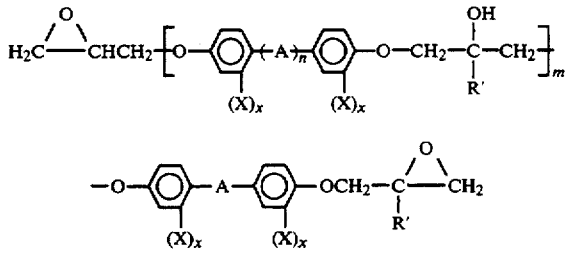

(b) [a mono-nucleus chain tending agent containing N-heterocyclic fatty groups and] *an N-heterocyclic fatty amino chain-extended agent* at least two active hydrogen atoms and represented by the formulas,

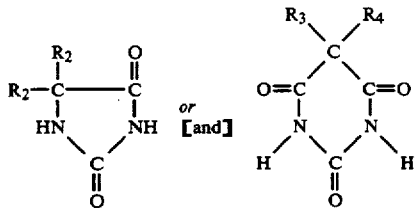

and (c) at least one catalyst for catalyzing the reaction between components (a) and (b).

1 Claim, No Drawings

HYDANTOIN OR BARBITURIC ACID-EXTENDED EPOXY RESIN COMPOSITION

Matter enclosed in heavy brackets [ ] appears in the original patent but forms no part of this reissue specification; matter printed in italics indicates the additions made by reissue.

BACKGROUND OF THE INVENTION

This invention relates to an epoxy resin composition used for the fabrication of a heat-resistant printed circuit laminate.

Necessitated by the trends in electronic packaging characterized by light weight and small size, the requirements in performance of laminates for printed circuit boards such as heat resistance, dimensional stability and mechanical workability are getting harsher. Various epoxy resin compositions have been developed for the fabrication of printed circuit laminates with improved heat-resisting characteristics, dimensional stability and workability. Standard FR-4 laminate is a well known printed circuit board laminate which is now not accessible to modern techniques, such as Surface Mount Technology (SMT). FR-laminate has higher heat resisting characteristics according to NEMA specifications, but is found to be difficult to process due to its high crosslinking density. The glass transition temperatures of these laminates are about 150–160 deg C. Since the laminates for multilayer printed circuit boards are generally manufactured through a hot pressing process at about 180 deg C., the above known laminates especially those having fine lines in inner layers of the boards are usually prone to destruction during the lamination process.

Prior arts described the preparing of epoxy resins by reacting epichlorohydrin with hydantoin or barbituric acid. The resins thus obtained contain a fatty amine which includes heterocyclic groups and exhibit good electrical properties, good water-resistance, and good thermal or dimensional stability. U.S. Pat. No. 4,071,477 discloses a hydantoin based epoxy resin which has good water resisting properties. U.S. Pat. Nos. 3,542,803, 3,592,823 and 3,975,397 disclose epoxy resins containing binucleus hydantoin, and exhibit good water-resistance. U.S. Pat. No. 4,672,101 discloses a compound having a glass-transition temperature greater than 240 deg C., which is prepared by reacting a hydantoin-based epoxy with diamino diphenyl sulfone. U.S. Pat. No. 4,459,392 discloses an epoxy resin prepared from hydantoin and barbituric acid. The mechanical strength and dimensional stability of a polyester resin can be improved when it is blended with the epoxy resin disclosed in U.S. Pat. No. 4,459,392. U.S. Pat. No. 3,779,949 discloses a high molecular weight epoxy resin with a long pot-life and good weather fastness, which is prepared by reacting an epoxy resin with a binucleus heterocyclic compound as a chain extender.

SUMMARY OF THE INVENTION

An object of the present invention is to provide a resin composition used for making a printed circuit board laminate with a glass transition temperature higher than 180 deg C., good heat-resistance and good mechanical workability.

The present invention provides resin compositions including a modified epoxy resin which is obtained by reacting an epoxy resin with a mono-nucleus N-heterocyclic fatty compound as a chain extender, a polyfunctional epoxy resin and curing agents. The resin composition thus obtained has a glass transition temperature higher than 180 deg C. The advantages of the resultant modified resin composition are as follows:

1. The modified resin composition has a low chlorine content since the method for preparing the resin composition excludes the step of using epichlorohydrin;
2. The high molecular weight of the modified resin composition results in lower curing thermal stress. The hydantoin or barbituric acid used in the preparation of the resin composition provides good electrical properties and flame-resisting characteristics;
3. The employment of a chain extender in the modified resin composition provides good thermal stability and lowers the bromine content of resins to about 15%;
4. The modified resin composition is of good toughness and thus provides good drilling characteristics;
5. The modified resin composition has good compatibility with glass fabrics, thereby reducing the delamination problem occured during the soldering process of printed circuit boards; and
6. The modified resin composition has a better dimensional stability than conventional epoxy resin compositions; and
7. Laminates using the resin composition of the present invention as a substrate have a lower cost than those with high glass transition temperatures such as polymide or BT resins.

The composition according to the present invention consists of (1) a modified epoxy resin (2) a bromine-containing bisphenol-A based epoxy resin (3) a polyfunctional epoxy resin (4) a curing agent and (5) an accelerator.

The modified epoxy resin is the reaction product of the following compounds (a), (b), and (c).

Compound (a) is a low equivalent weight epoxy resin having at least two reactive epoxy groups with the general formula:

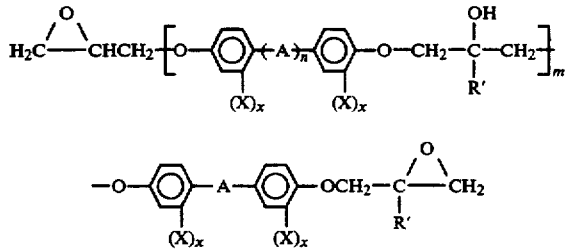

where A denotes a divalent hydrocarbon with 1–10 carbon atoms or a group represented by

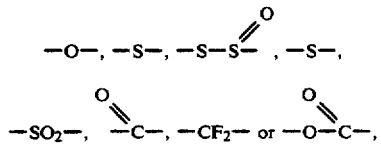

X denotes a monovalent hydrocarbon with 1–10 carbon atoms or a halogen, m is 1–10 on average, n is 0 or 1, x is 0 to 4, R′ represents H or a hydrocarbon group with 1–4 carbon atoms. Other suitable compounds for the modified epoxy resin include fatty epoxy resins such as 3,4 epoxy cyclohexyl-methyl-3,4-epoxy cyclohexane, carboxylate, vinyl cyclo hexene diepoxy, etc., or phenol formaldehyde resin based epoxy resin such as Novalac epoxy, etc.

Compound (b) is [a heterocyclic] *an N-heterocyclic* fatty amino chain extender having at least two active H to react with the epoxy groups, whose general formula is

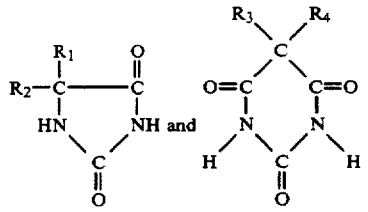

where $R_1$, $R_2$, $R_3$, $R_4$ each denote a hydrogen atom or an alkyl group having 1–10 carbon atoms. Suitable compounds (b) include 5,5-dimethyl hydantoin, hydantoin-5-methyl hydantoin, 5,5-diethyl hydantoin, 5-methyl-5-ethyl hydantoin or barbituric acid, etc.

Compound (c) contains one or more catalysts for the chain extending reaction of compounds (a) and (b). The catalyst may be quaternary phosphonium compounds, tertiary amines, or quaternary ammonium compounds.

The weight ratio of the compounds (b) to (a) may be 0.1 to 1.0. The most preferable epoxide equivalent per equivalent of the active hydrogen is 1.0. The amount of the chain extending catalyst, i.e. compound (c), is 0.00005 to 0.1, preferably 0.00075 to 0.025 per epoxide equivalent. The viscosity of the reaction product of the compounds (a), (b) and (c) is 1–6 times, preferably 1.25–4.5 times, the viscosity of the mixture before reaction. The amount of such a modified epoxy resin to be used is 10–90%, preferably 25–50%, by weight based on the total weight of the resin composition according to the present invention.

The bromine-containing epoxy resins may include a tetra-bromo bisphenol A based epoxy resin, a tetra-bromo bispbenol-A-bisphenol-A epoxy resin, a tetra-bromobisphenol-A-benzene formaldehyde epoxy resin. The amount of bromine contained in the bromine-containing epoxy resin may be 10–50% by weight. The number of the equivalents of the bromine-containing compound is 330–1500, preferably 330–575. The amount of the bromine-containing epoxy resin to be used is 10–50% by weight based on the total weight of the resin composition.

The polyfunctional epoxy resin may be N,N,N,N',-tetra kis-(2,3-epoxy propyl)-P,P'-methylene dianiline, N,N-bis(2,3-epoxy propyl)4-amino-phenyl glycidyl ether, N,N,N',N'-tetra glycidyl-4-4' diamino diphenyl methane, 1,1,2,2,-tetra kis (2,3-epoxy propoxy)-phenyl ethane, triglycidyl ether of triphenylene methane or a mixture of the above compounds.

The polyfunctional epoxy resins contain at least 3 functional groups and the amount used may be 5–40% by weight, preferably 10–30%, based on the total weight of the resin composition.

One or more curing agents are used for cross-linking the above epoxy resins. The curing agent may be primary or secondary amines, polyureas, mercaptans, carboxylic acids, carboxylic acid anhydrides, guanidines, biguanides, aromatic sulfone acid amides, imidazoles, Lewis acids, complex salts of Lewis acids, complex catalysts, and phenols. These compounds may be methylene dianiline, diamino diphenyl sulfone, aminoethyl pyridine, 2-methyl imidazole, dicyandiamide, ethylene diamine diethylene triamine, triethylene tetramine, diamino-cyclohexane, 4,4'-methylene dicyclohexylamine, phenylene diamine, sulfanilamide, aminoethyl-piparidize, boron trifluoride monoethylamine, phthalic anhydride, 4,4',-diaminodiphenyl methane trimellitic anhydride, pyromellitic dianhydride, nadic methyl anhydride, trimellitic acid and mixtures of the above compounds. The ratio of the active reactive groups in each mole of the curing agent to epoxide equivalents of an epoxy resin is 0.5–1.5, preferably 0.75–1.0.

One or more accelerators may be used in the present invention. Suitable accelerators are tertiary amines, imidazoles and boron trifluoride amino complex salts. The above described accelerators may be 1-methylimidazole, 2-mehylimidazole, 2-ethyl-4-methylimidazole, 1-benzyl-2-methyl imidazole, benzyl-dimethylamine, triethylamine 2,4,6-tris (dimethylamino methylamino methyl)phenol, pyridine, quinoline, pyrazine hexamethylene tetramine, borontrifloride diethylether, borontrifluoride triethanol amine, borontrifluoride monoethylamine, borontrifluoride methyl ethyl amine and mixtures thereof. The amount of the accelerator used is 0.0001 to 0.01, preferably 0.001–0.005 by weight based on the total weight of the resins contained in the resin composition according to the present invention.

The five components described hereinbefore which form a resin composition according to the present invention may be dissolved in a suitable polar or nonpolar solvent such as ketones, alcohols, glycols, ethers, aromatic and aliphatic hydrocarbons, cyclic ethers, halogenated hydrocarbons, amides, etc. The viscosity of the resin composition is 20–200 cps.

The present invention will be described in detail with reference to the following examples.

EXAMPLE1

100 g of 5,5-dimethyl hydantoin was put in a one liter reactor provided with an agitator. Then, 600 g of a bisphenol-A type epoxy resin "Epon 828" was added to the reactor. After the above two compounds were well stirred at 120 deg C., 1 g of a solution of benzyl trimethyl ammonium chloride in MEOH (60%) was added thereto while stirring continued at 120 deg C. The solution turned gradually yellow and clear. After one hour, the heating source was removed from the reactor and 400 mg of methyl ethyl ketone (MEK) was added to and well mixed with the reaction products. The weight equivalent of epoxide group of the product was determined by titration to be 550.

EXAMPLE2

100 g of barbituric acid was put in a one liter reactor with a mechanical stirrer and homogeneously mixed with 600 g of an epoxy resin (Epon 828) at 150 deg C. After one hour mixing, 1 g of a solution of benzyl trimethyl ammonium chloride/MeOH (60%) was added to the reactor. The mixture in the reactor gradually turned from white to orange. After reacting for two hours, the reaction system turned into a brownish transparent one. Then, 300 ml of N,N, dimethyl formaide (DMF) was added to the reactor. After mixing, the solution was taken out of the reactor. The weight equivalent of epoxide group of the resulting product was determined to be 625.

EXAMPLE3

500 g of the modified epoxy resin of Example 1 was put into a one liter three-necked flask with a mechanical stirrer. 400 g of Der 542, 300 g of an epoxy resin known under the tradename "EPON 103", 400 ml of acetone, and 200 ml of toluene were added to the flask and agitated together. The flask was kept at 80 deg C. during stirring. When the reaction system was well mixed, 214 g of diamino-diphenylsulphone was added to the flask. After stirring for two hours at the same temperature, 1.2 g of boron trifluoride methyl ethyl amine (MEA) was added and agitated therewith for 1 hour. The resin varnish obtained had a viscosity of 105 cps. A test sample of printed circuit board was prepared by impregnating a 7628 glass cloth with the obtained resin varnish, drying and laminating the impregnated prepreg with a copper clad.

EXAMPLE 4

An epoxy resin varnish was prepared using the same components and procedure as in Example 3 except that the modified epoxy resin of Example 1 was replaced by the one described in Example 2. A test sample was prepared in the same way as described in Example 3.

Table I shows the result of the testing.

TABLE I

| | Test sample of Ex. 3 | Test sample of Ex. 4 |
|---|---|---|
| EHT, g | 500 | |
| EBT, g | | 500 |
| EPON1031, g | 300 | 300 |
| Der 542, g | 400 | 400 |
| DDS, g | 212 | 207 |
| Tg, (°C.) | 196 | 190 |
| CTE, (cm/cm °C.) | 5.6 × 10 | 5.7 × 10 |
| Dielectric constant | 4.3–4.8 | 4.3–4.8 |
| Dielectric loss | 0.015–0.020 | 0.015–0.020 |
| Volume resistance Ωcm | $>1 \times 10^{15}$ | $>1 \times 10^{15}$ |
| Surface resistance Ω | $>5 \times 10^{13}$ | $>5 \times 10^{13}$ |
| Soldering test (sec.) | >120 | >120 |
| Moisture absorption % | 0.12 | 0.15 |
| Smear forming | <2% | <2% |
| Flame-resistance | 94 V-O | 94 V-O |

Remarks:

EHT—Hydantoin based modified epoxy resin (Example 1)

EBT—Barbituric based modified epoxy resin (Example 2)

CTE—Expansion coefficient below Tg, (Thermal Mechanical Analysis)

Tg—determined by Thermal Mechanical Analysis method

Soldering test—determined by a dipping method at 260 deg C.

Smear forming—drilling condition: speed: 6000 rpm, feed rate: 120 IPM, drill bits: 4500

We claim:

1. A resin composition for making a printed circuit board comprising:

(1) a modified epoxy resin obtained by reacting (a) a low molecular weight epoxy resin having at least two epoxide groups which [have] *has* the following formula,

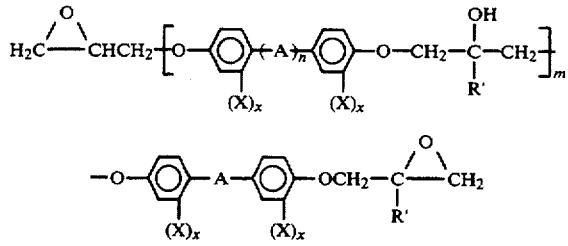

where A denotes a divalent hydrocarbon with 1–10 carbon atoms or a group represented by

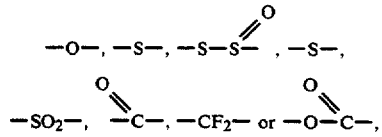

X denotes a monovalent hydrocarbon with 1–10 carbon atoms or a halogen, m is 1–10 on average, n is 0 or 1, x is 0 to 4, R' represents H or a hydrocarbon group with 1–4 carbon atoms, (b) [a mononucleus chain extending agent containing N-heterocyclic fatty groups and] *an N-heterocyclic fatty amino chain-extending agent having* at least two active hydrogen atoms [or] represented by the formula

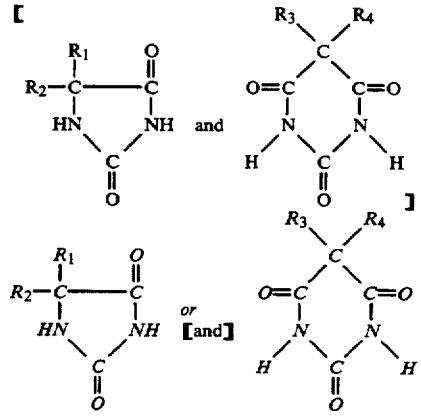

*wherein $R_1$, $R_2$, $R_3$ and $R_4$ each denotes a hydrogen atom or an alkyl group having 1–10 carbon atoms* and (c) at least one catalyst for catalyzing the reaction between components (a) and (b), the amount of the modified epoxy resin being 10–70% by weight based on the total weight of the cured resin composition, (2) 5–50% by weight based on the total weight of the resin composition, of at least one polyfunctional epoxy resin having at least 3 epoxy groups per molecule, (3) 20–40% by weight based on the total weight of the resin composition, of at least one bromine containing-epoxy resin having an equivalent of 330–1500 with a bromine content of 10–50% based on the bromine containing-epoxy resin, (4) at least one curing agent selected from the group [including] *consisting of* anhydrides, amines, acids, Lewis acids, imidazoles, complex salts of Lewis acid and phenols, the amount of the active reactive groups in each mole of the curing agent being 0.5–1.5 per epoxide equivalent, (5) 0.001–5% by weight, based on the total weight of the resin composition, of at least one accelerator for catalyzing the curing reaction of the components (1), (2), (3) and (4).

* * * * *